(12) United States Patent
Zanbaghi

(10) Patent No.: US 10,985,746 B1
(45) Date of Patent: Apr. 20, 2021

(54) TRANSDUCER DRIVER ENHANCEMENT WITH INTELLIGENT THRESHOLD SELECTION WITHIN NON-OVERLAP GENERATOR

(71) Applicant: Cirrus Logic International Semiconductor Ltd., Edinburgh (GB)

(72) Inventor: Ramin Zanbaghi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/824,414

(22) Filed: Mar. 19, 2020

(51) Int. Cl.
  *H03K 17/081* (2006.01)
  *H03K 17/082* (2006.01)
  *H02M 1/08* (2006.01)

(52) U.S. Cl.
  CPC .......... *H03K 17/0822* (2013.01); *H02M 1/08* (2013.01); *H03K 17/081* (2013.01)

(58) Field of Classification Search
  CPC .. H03K 17/0822; H03K 17/081; H03K 17/08; H02M 1/08
  See application file for complete search history.

(56) References Cited

U.S. PATENT DOCUMENTS

2020/0195121 A1* 6/2020 Keskar ............... H03K 17/6871

* cited by examiner

*Primary Examiner* — Jung Kim
(74) *Attorney, Agent, or Firm* — Jackson Walker L.L.P.

(57) ABSTRACT

Non-overlap generation circuitry may include a first portion configured to condition an input signal to generate a first predriver signal, the first portion comprising a first switching threshold logic path and a second switching threshold logic path in parallel with the first switching threshold logic path, wherein the first portion is configured to select between the first switching threshold logic path and the second switching threshold logic path based on the input signal. The non-overlap generation circuit may also include a second portion configured to condition the input signal to generate a second predriver signal, the second portion comprising a third switching threshold logic path and a fourth switching threshold logic path in parallel with the third switching threshold logic path, wherein the second portion is configured to select between the third switching threshold logic path and the fourth switching threshold logic path based on the input signal.

12 Claims, 4 Drawing Sheets

TRANSDUCER DRIVER ENHANCEMENT WITH INTELLIGENT THRESHOLD SELECTION WITHIN NON-OVERLAP GENERATOR

FIELD OF DISCLOSURE

The present disclosure generally relates to an integrated circuit, and, more particularly, to systems and methods for reducing shoot-through current caused by capacitive coupling in a switched circuit, for example a switched output stage of a power converter.

BACKGROUND

Many electronic devices on the market today often use power converters to convert electric energy from one form to another (e.g., converting between alternating current and direct current), amplify a voltage or current of an electrical signal, modify a frequency of an electrical signal, or some combination of the above. Examples of power converters may include boost converters, buck converters, and audio amplifiers (including, but not limited to, Class D and Class H amplifiers). Such power converters often employ a switched output stage, an example of which is shown in FIG. 1. In FIG. 1, switched output stage 100 comprises a pull-up device 102 (e.g., a switch, a p-type metal-oxide-semiconductor field effect transistor, etc.) coupled at its non-gate terminals between a supply voltage and an output node and a pull-down device 104 (e.g., a switch, an n-type metal-oxide-semiconductor field effect transistor, etc.) coupled at its non-gate terminals between a ground voltage and the output node. Predriver circuitry 106 may receive an input voltage $v_{IN}$ (typically a pulse-width-modulated input voltage signal) and apply control logic and/or buffering to such input voltage to drive a pull-up device driving signal voltage $v_P$ to the gate terminal of pull-up device 102 and to drive a pull-down device driving signal voltage $v_N$ to the gate terminal of pull-down device 104, wherein $v_P$ and $v_N$ are each a function of $v_{IN}$. Accordingly, switched output stage 100 generates an output voltage $v_{OUT}$ to its output node which is a function of $v_{IN}$.

One drawback in using switched output stages in a power converter is the presence of a phenomenon known as "shoot-through current." Shoot-through current may be defined as the rush of current that occurs from the supply voltage to the ground voltage through pull-up device 102 and pull-down device 104 while both pull-up device 102 and pull-down device 104 are on for an overlapping period during transition of output voltage signal $v_{OUT}$. For example, as output voltage signal $v_{OUT}$ transitions from a ground voltage to a supply voltage (e.g., in response to pull-up device driving signal voltage $v_P$ falling from a high voltage to a low voltage), predriver circuitry 106 may cause pull-down device driving signal voltage $v_N$ to experience an unwanted spike if $v_{OUT}$ toggles to a low voltage after pull-down device 104 has turned off. Similarly, as output voltage signal $v_{OUT}$ transitions from a supply voltage to a ground voltage (e.g., in response to pull-down device driving signal voltage $v_N$ rising from a low voltage to a high voltage), an unwanted spike voltage may occur on pull-up device driving signal voltage $v_P$. Such spike voltages may lead to numerous undesirable effects, including the presence of unneeded idle shoot-through current flowing through both of pull-up device 102 and pull-down device 104 (e.g., thereby wasting energy and potentially causing undesirable heat), and/or communication of incorrect signals (e.g., incorrect logic signals in predriver circuitry 106).

To overcome the problems caused by shoot-through current, circuit designers often use closed loop non-overlap generators in which signals driving the main driver device gates are fed back to the non-overlap generators. For example, as shown in circuit 200 of FIG. 2, predriver circuitry 106 may be split into PMOS predriver circuitry 106A to drive pull-up device driving signal voltage $v_P$ to the gate terminal of pull-up device 102 and NMOS predriver circuitry 106B to drive pull-down device driving signal voltage $v_N$ to the gate terminal of pull-down device 104. Non-overlap generator circuitry may include a logical OR gate 208 configured to logically OR pull-down device driving signal voltage $v_N$ with input voltage $v_{IN}$ to generate a predriver input signal $DRV_P$ to PMOS predriver circuitry 106A and may also include a logical AND gate 210 configured to logically AND pull-up device driving signal voltage $v_P$ with input voltage $v_{IN}$ to generate a predriver input signal $DRV_N$ to NMOS predriver circuitry 106B. However, while the non-overlap generator circuitry shown in FIG. 2 may reduce shoot-through current, the use of such non-overlap generator circuitry may have disadvantages. For example, the non-overlap generator circuitry may introduce a longer non-overlap time which may reduce modulation index and/or dynamic range of output voltage signal $v_{OUT}$. As another example, the non-overlap generator circuitry may result in decreased total harmonic distortion performance due to increases in body diode conduction times in pull-up device 102 and/or pull-down device 104.

Accordingly, systems and methods that minimize shoot-through current while also maximizing modulation index and dynamic range and minimizing total harmonic distortion are desired.

SUMMARY

In accordance with the teachings of the present disclosure, certain disadvantages and problems associated with shoot-through current in switched circuits may be reduced or eliminated.

In accordance with embodiments of the present disclosure, a transducer driver may include an output driver configured to drive an output signal to a transducer as a function of an input signal received by the transducer driver, the output driver comprising a pull-up device coupled at its non-gate terminals between a supply voltage and an output of the transducer driver and a pull-down device coupled at its non-gate terminals between a ground voltage and the output of the transducer driver. The transducer driver may also include predriver circuitry for driving one or more driving signals to the output driver, wherein the output signal is a function of the one or more driving signals, wherein the predriver circuitry comprises pull-up predriver circuitry for receiving a first predriver signal and driving a first driving signal as a function of the first predriver signal to a gate of the pull-up device, pull-down predriver circuitry for receiving a second predriver signal and driving a second driving signal as a function of the second predriver signal to a gate of the pull-down device, and non-overlap generation circuitry for minimizing shoot-through current through the pull-up device and the pull-down device. The non-overlap generation circuitry may include a first portion configured to condition the input signal to generate the first predriver signal, the first portion comprising a first switching threshold logic path having a first switching threshold and a second switching threshold logic path in parallel with the first switching threshold logic path and having a second switching threshold lower than the first switching threshold, wherein the first portion is configured to select between the first switching threshold logic path and the second switching threshold logic path based on the input signal. The non-overlap generation circuit may also include a second portion configured to condition the input signal to generate the second predriver signal, the second portion comprising a third switching threshold logic path having a third switching threshold and a fourth switching threshold logic path in parallel with the third switching threshold logic path and having a fourth switching threshold higher than the third switching threshold, wherein the second portion is configured to select between the third switching threshold logic path and the fourth switching threshold logic path based on the input signal.

In accordance with these and other embodiments of the present disclosure, a method may include driving, with an output driver, an output signal to a transducer as a function of an input signal received by a transducer driver, wherein the output driver comprises a pull-up device coupled at its non-gate terminals between a supply voltage and an output of the transducer driver and a pull-down device coupled at its non-gate terminals between a ground voltage and the output of the transducer driver. The method may also include driving, with predriver circuitry, one or more driving signals to the output driver, wherein the output signal is a function of the one or more driving signals, and wherein the predriver circuitry comprises pull-up predriver circuitry for receiving a first predriver signal and driving a first driving signal as a function of the first predriver signal to a gate of the pull-up device and pull-down predriver circuitry for receiving a second predriver signal and driving a second driving signal as a function of the second predriver signal to a gate of the pull-down device. The method may additionally include conditioning, with a first portion of non-overlap generation circuitry, the input signal to generate the first predriver signal, the first portion comprising a first switching threshold logic path having a first switching threshold and a second switching threshold logic path in parallel with the first switching threshold logic path and having a second switching threshold lower than the first switching threshold, wherein the first portion is configured to select between the first switching threshold logic path and the second switching threshold logic path based on the input signal. The method may further include conditioning, with a second portion of the non-overlap generation circuitry, the input signal to generate the second predriver signal, the second portion comprising a third switching threshold logic path having a third switching threshold and a fourth switching threshold logic path in parallel with the third switching threshold logic path and having a fourth switching threshold higher than the third switching threshold, wherein the second portion is configured to select between the third switching threshold logic path and the fourth switching threshold logic path based on the input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
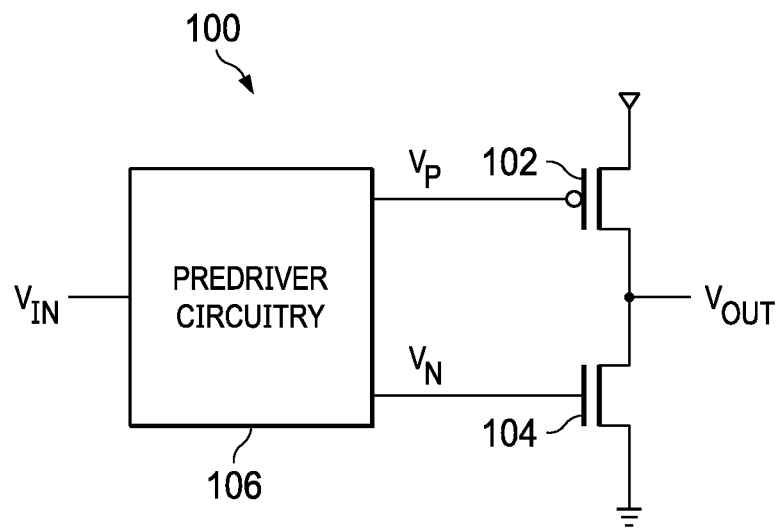
FIG. 1 illustrates a switched output stage for a power converter, as is known in the art.
Figure 2:
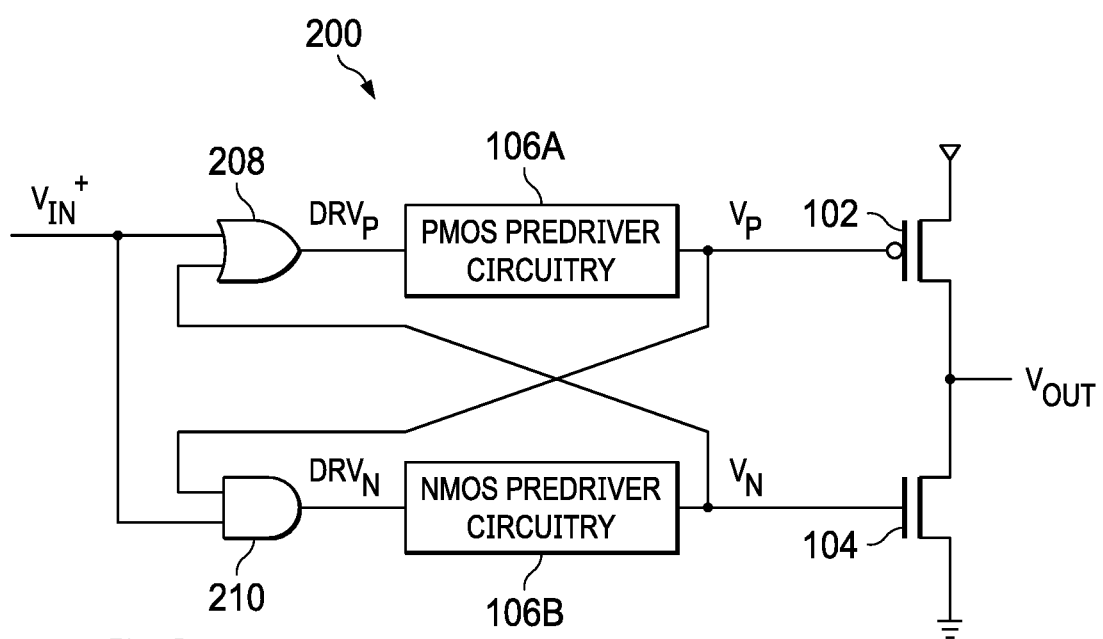
FIG. 2 illustrates an example circuit for reducing shoot-through current in a switched output stage of a power converter as is known in the art.
Figure 3:
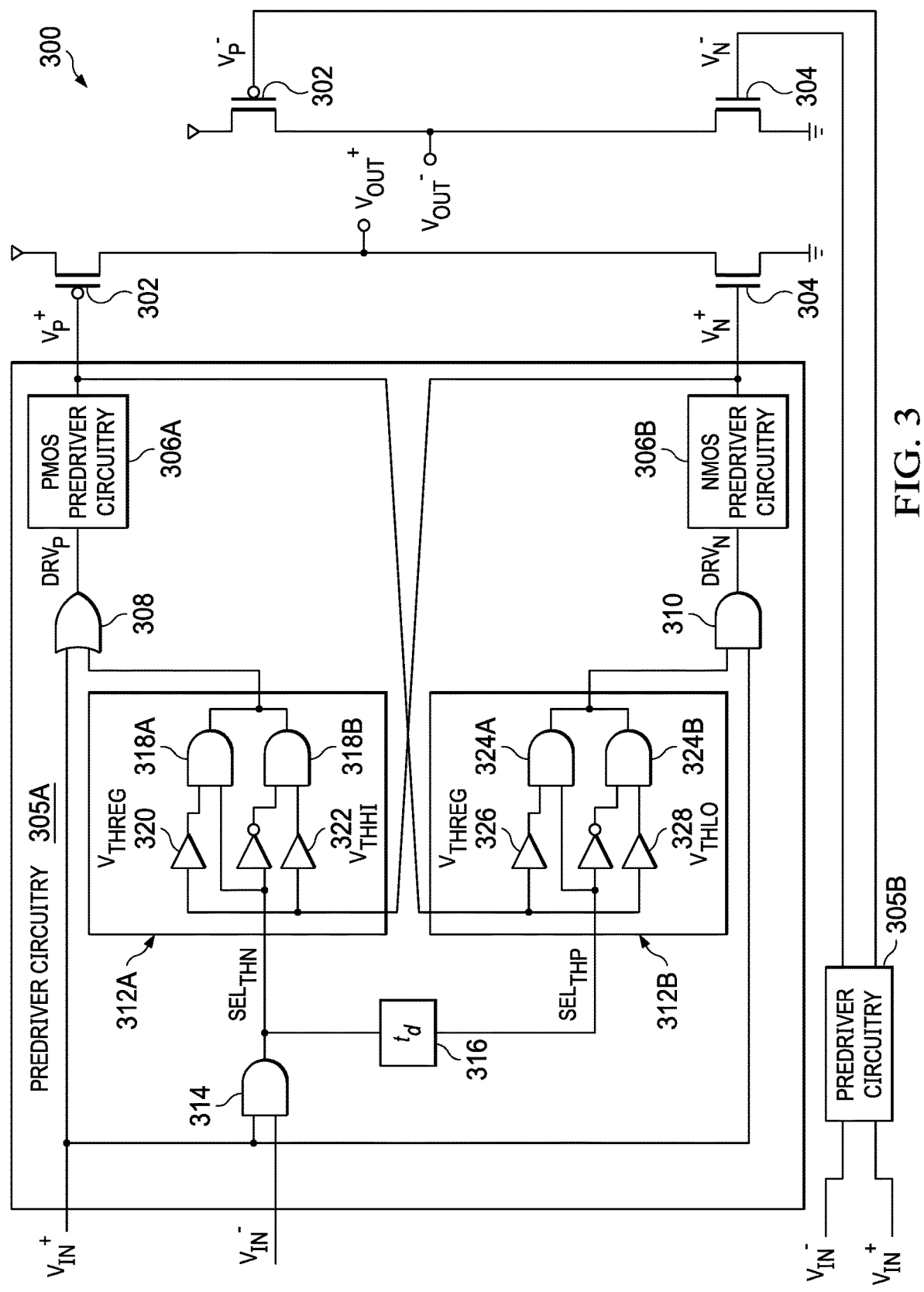
FIG. 3 illustrates an example switched output stage with circuitry for reducing shoot-through current and intelligent threshold selection circuitry for improving total harmonic distortion compared to existing approaches, in accordance with embodiments of the present disclosure.

FIG. 3 illustrates an example differential output switched output stage 300 with circuitry for reducing shoot-through current and intelligent threshold selection circuitry for improving total harmonic distortion compared to existing approaches, in accordance with embodiments of the present disclosure. As shown in FIG. 3, switched output stage 300 may comprise an H-bridge output having a positive polarity side for generating positive polarity output voltage $V_{OUT^+}$ and a negative polarity side for generating negative polarity output voltage $V_{OUT^-}$ (e.g., such that an output voltage $v_{OUT}=V_{OUT^+}-V_{OUT^-}$). Also as shown in FIG. 3, each polarity side of differential output switched output stage 300 may comprise a pull-up device 302 (e.g., a switch, a p-type metal-oxide-semiconductor field effect transistor, etc.) coupled at its non-gate terminals between a supply voltage and an output node and a pull-down device 304 (e.g., a switch, an n-type metal-oxide-semiconductor field effect transistor, etc.) coupled at its non-gate terminals between a ground voltage and the output node.

Predriver circuitry 305A may receive positive polarity input signal $V_{IN^+}$ and negative polarity input signal $V_{IN^-}$ and condition positive polarity input signal $V_{IN^+}$ and negative polarity input signal $V_{IN^-}$ to generate a pull-up device driving signal voltage $v_{P^+}$ to the gate terminal of pull-up device 302 of the positive polarity side and generate a pull-down device driving signal voltage $v_{N^+}$ to the gate terminal of pull-down device 304 of the positive polarity side. Similarly, predriver circuitry 305B may receive negative polarity input signal $V_{IN^-}$ and positive polarity input signal $V_{IN^+}$ and condition negative polarity input signal $V_{IN^-}$ and positive polarity input signal $V_{IN^+}$ to generate a pull-up device driving signal voltage $v_{P^-}$ to the gate terminal of pull-up device 302 of the negative polarity side and generate a pull-down device driving signal voltage $v_{N^-}$ to the gate terminal of pull-down device 304 of the negative polarity side.

FIG. 3 depicts further details of predriver circuitry 305A. Predriver circuitry 305B may be similar to that of predriver circuitry 305A with the exception that the bottom input of logical AND gate 314 of predriver circuitry 305B may receive positive polarity input signal $V_{IN^+}$ instead of negative polarity input signal $V_{IN^-}$. Functionality of differential output switched output stage 300 may be described below with reference to predriver circuitry 305A, but it is understood that as a dual to predriver circuitry 305A, predriver circuitry 305B will operate in a similar manner to predriver circuitry 305A, with analogous elements and signals of predriver circuitry 305B having similar characteristics to that of predriver circuitry 305A.

As shown in FIG. 3, predriver circuitry 305A may include PMOS predriver circuitry 306A. PMOS predriver circuitry 306A may receive a predriver input signal $DRV_P$ derived from an input voltage $v_{IN}$ (typically a pulse-width-modulated input voltage signal) and apply control logic and/or buffering to such input voltage to drive a pull-up device driving signal voltage $v_P$ to the gate terminal of pull-up device 302, such that $v_P$ is a function of $v_{IN}$. Similarly, predriver circuitry 305A may include NMOS predriver circuitry 306B. NMOS predriver circuitry 306B may receive a predriver input signal $DRV_N$ derived from an input voltage $v_{IN}'$ (e.g., a complement $v_{IN}'$ of input voltage $v_{IN}$) and apply control logic and/or buffering to such input voltage to drive a pull-down device driving signal voltage $v_N$ to the gate terminal of pull-down device 304, such that $v_N$ is a function of $v_{IN}$. Accordingly, switched output stage 300 may generate an output voltage $v_{OUT}$ to its output node which is a function of $v_{IN}$.

As shown in FIG. 3, predriver circuitry 305A may include non-overlap circuitry for reducing shoot-through current comprising logical OR gate 308, logical AND gate 310, intelligent threshold selection circuitry 312A and 312B, logical AND gate 314, and delay element 316. Logical OR gate 308 may be configured to logically OR pull-down device driving signal voltage $v_N$, as conditioned by intelligent threshold selection circuitry 312A, with input voltage $v_{IN}$ to generate a predriver input signal $DRV_P$ to PMOS predriver circuitry 306A. Similarly, logical AND gate 310 may be configured to logically AND pull-up device driving signal voltage $v_P$, as conditioned by intelligent threshold selection circuitry 312B, with a complement of input voltage $v_{IN}'$ to generate a predriver input signal $DRV_N$ to NMOS predriver circuitry 306B.

Intelligent threshold selection circuitry 312A may comprise a pair of logical AND gates 318A and 318B, each having their respective outputs drive an input of logical OR gate 308. Logical AND gate 318A may logically AND a threshold selection signal $SEL_{THN}$ and the output of a regular threshold logic buffer gate 320 having a threshold $V_{THREG}$ and configured to buffer pull-down device driving signal voltage $v_N$. Logical AND gate 318B may logically AND the logical complement of threshold selection signal $SEL_{THN}$ and the output of a high threshold logic buffer gate 322 having a threshold $v_{THHI}$ higher than threshold $v_{THREG}$ and configured to buffer pull-down device driving signal voltage $v_N$. As shown in FIG. 3, logical AND gate 314 may generate threshold selection signal $SEL_{THN}$ as the logical AND of input voltage $v_{IN}$ and its complement $v_{IN}'$.

The functionality of intelligent threshold selection circuitry 312A may be illustrated by reference to FIGS. 4A and 4B, which depicts a timing diagram of selected signals of switched output stage 300. Solid lines for the waveforms depicted in FIG. 4A represent waveform signals that would occur if regular threshold $v_{THREG}$ were used while the dotted lines for the waveforms represent signals in which intelligent threshold selection circuitry 312A selects use of higher threshold $v_{THHI}$. As shown in FIG. 4A, the presence of high threshold logic buffer gate 322 may cause predriver input signal $DRV_P$ to toggle (e.g., increase from high to low) earlier so that the process of turning on pull-up device 302 begins earlier. In the case shown in FIG. 4A, current may be flowing from the electrical node of positive polarity output voltage $V_{OUT^+}$ to the electrical node of negative polarity output voltage $V_{OUT^-}$. Having higher threshold $v_{THHI}$ on the feedback path comprising intelligent threshold selection circuitry 312A may shorten a body-diode conduction time of pull-down device 304, which may improve output signal $V_{OUT}$ and overall total harmonic distortion compared to existing approaches. In this case, no shoot-through current may exist due to body-diode conduction of pull-down device 304. In other words, the body diode of pull-down device 304 may turn on after the pull-down device 304 turns off, and during such time, pull-up device 302 may remain off, but may be in the process of turning on. Accordingly, in such a case, using higher threshold $v_{THHI}$ for threshold voltage $v_{TH}$ may be preferable to regular threshold $v_{THREG}$.

Figure 4B:
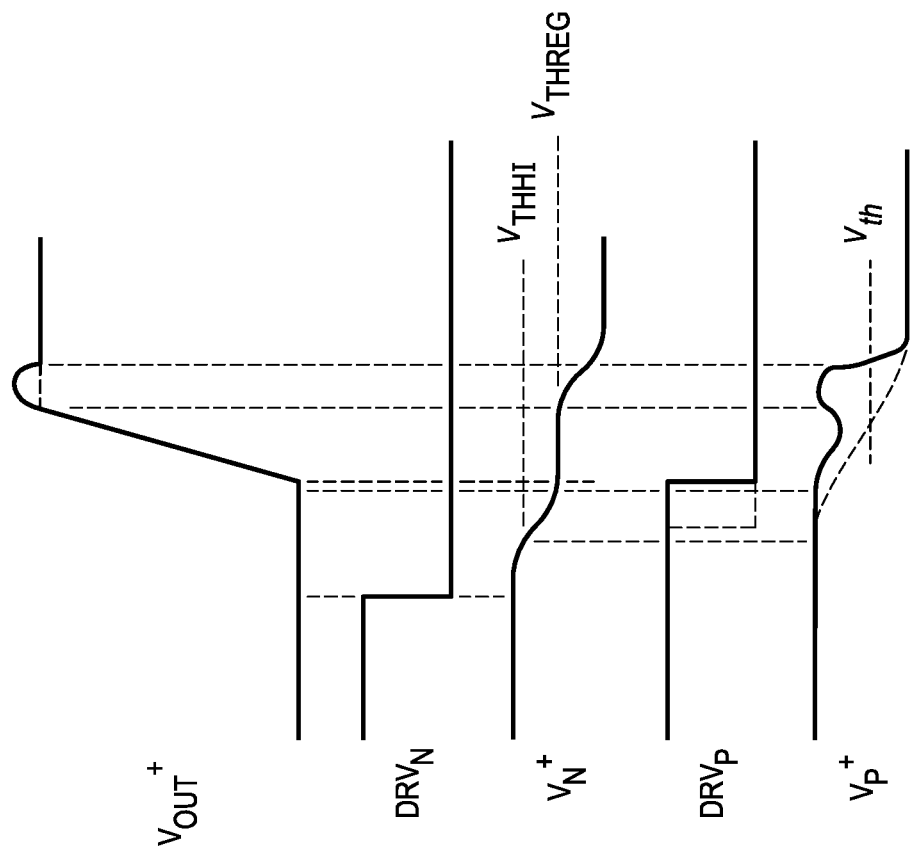
FIGS. 4A and 4B illustrate an example timing diagram for various signals of the example circuit depicted in FIG. 3, in accordance with embodiments of the present disclosure.
Figure 4A:
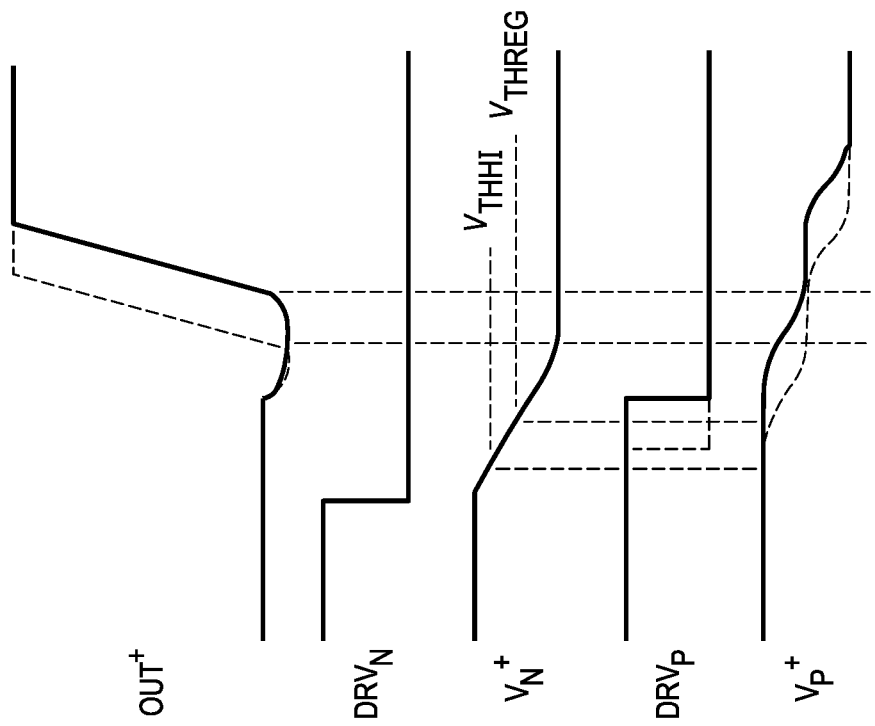

The signals shown in FIG. 4B are similar to that of FIG. 4A, except a load current through an output load of switched output stage 300 is opposite to that shown in FIG. 4A (e.g., current may be flowing from the electrical node of negative polarity output voltage $V_{OUT^-}$ to the electrical node of positive polarity output voltage $v_{OUT^+}$). Solid lines for the waveforms depicted in FIG. 4B represent waveform signals that would occur if regular threshold $v_{THREF}$ were used while the dotted lines for the waveforms represent signals in which intelligent threshold selection circuitry 312A selects use of higher threshold $v_{THHI}$. FIG. 4B shows that if higher threshold $v_{THHI}$ is maintained, then shoot-through may occur when load polarity changes. In FIG. 4B, the solid-line waveforms show that pull-up device 302 may have body-diode conduction (which means there is no shoot-through current) but the dotted-line waveforms show that for high-threshold $v_{THHI}$ selection, pull-up device 302 would not experience body-diode conduction as pull-down device 304 may turn on earlier leading to shoot-through.

Thus, based on a load current polarity, which may be represented by threshold selection signal $SEL_{THN}$, intelligent threshold selection circuitry 312A may select between regular threshold $v_{THREG}$ and higher threshold $v_{THHI}$.

Intelligent threshold selection circuitry 312B may operate in a similar manner. As shown in FIG. 3, intelligent threshold selection circuitry 312B comprise a pair of logical AND gates 324A and 324B, each having their respective outputs drive an input of logical AND gate 310. Logical AND gate 324A may logically AND a threshold selection signal $SEL_{THN}$ and the output of a regular threshold logic buffer gate 326 having a threshold $V_{THREG}$ and configured to buffer pull-up device driving signal voltage $v_P$. Logical AND gate 324B may logically AND the logical complement of threshold selection signal $SEL_{THP}$ and the output of a low threshold logic buffer gate 328 having a threshold $V_{THLO}$ lower than threshold $V_{THREG}$ and configured to buffer pull-up device driving signal voltage $v_P$. As shown in FIG. 3, logical AND gate 314 may generate threshold selection signal $SEL_{THP}$ as threshold selection signal $SEL_{THN}$ is delayed by a fixed delay $t_d$ (e.g., by delay element 316).

Figure 5A:
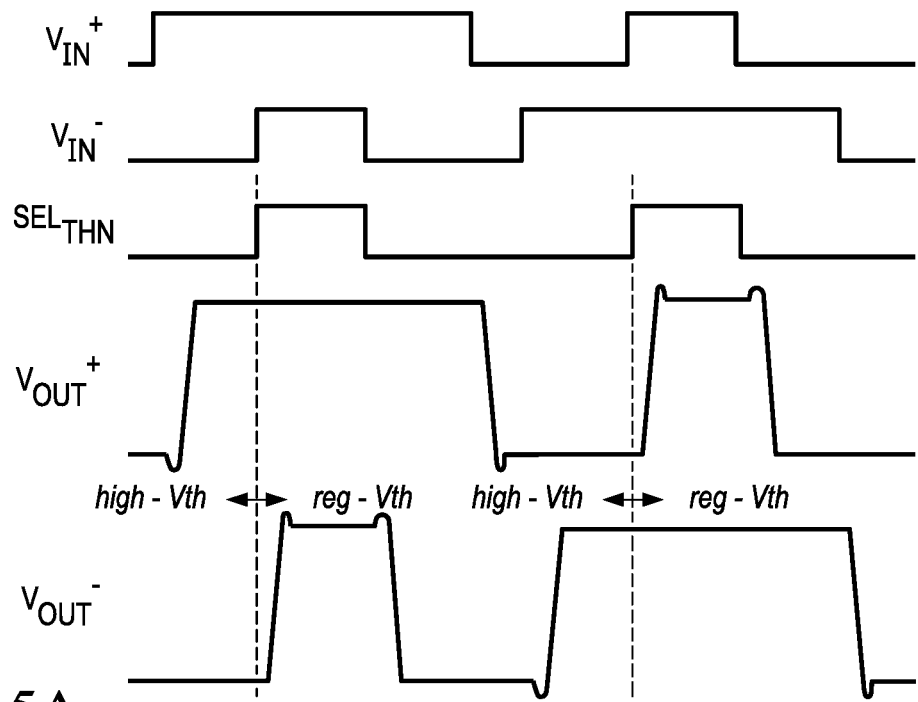
FIGS. 5A and 5B illustrate example timing diagrams for various signals of the example circuit depicted in FIG. 3, in accordance with embodiments of the present disclosure.
Figure 5B:
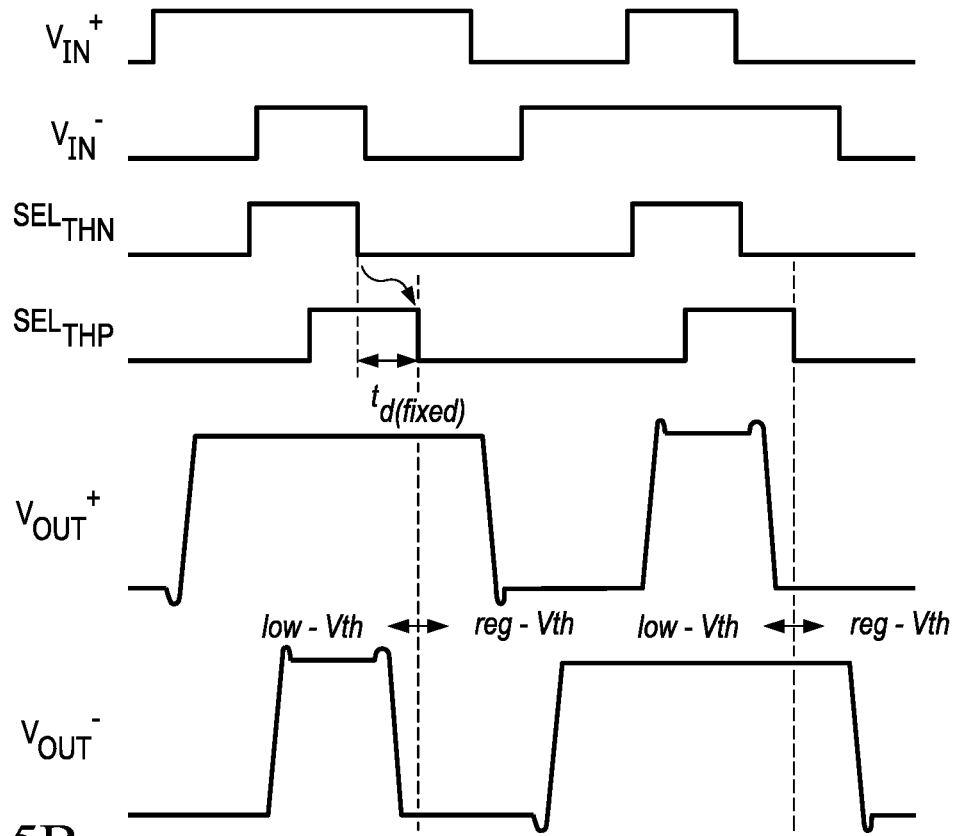

FIGS. 5A and 5B illustrate example timing diagrams for various signals of the example circuit depicted in FIG. 3, in accordance with embodiments of the present disclosure, in order to further show application of the different thresholds described above. FIG. 5A depicts threshold selection for the low-to-high transitions of positive polarity output voltage $v_{OUT^+}$ and negative polarity output voltage $V_{OUT^-}$ based on load current polarity, while FIG. 5B depicts threshold selection for the high-to-low transitions of positive polarity output voltage $V_{OUT+}$ and negative polarity output voltage $V_{OUT-}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A transducer driver comprising:
    an output driver configured to drive an output signal to a transducer as a function of an input signal received by the transducer driver, the output driver comprising:
        a pull-up device coupled at its non-gate terminals between a supply voltage and an output of the transducer driver; and
        a pull-down device coupled at its non-gate terminals between a ground voltage and the output of the transducer driver; and
    predriver circuitry for driving one or more driving signals to the output driver, wherein the output signal is a function of the one or more driving signals, and wherein the predriver circuitry comprises:
        pull-up predriver circuitry for receiving a first predriver signal and driving a first driving signal as a function of the first predriver signal to a gate of the pull-up device;
        pull-down predriver circuitry for receiving a second predriver signal and driving a second driving signal as a function of the second predriver signal to a gate of the pull-down device; and
        non-overlap generation circuitry for minimizing shoot-through current through the pull-up device and the pull-down device and comprising:
            a first portion configured to condition the input signal to generate the first predriver signal, the first portion comprising a first switching threshold logic path having a first switching threshold and a second switching threshold logic path in parallel with the first switching threshold logic path and having a second switching threshold lower than the first switching threshold, wherein the first portion is configured to select between the first switching threshold logic path and the second switching threshold logic path based on the input signal; and
            a second portion configured to condition the input signal to generate the second predriver signal, the second portion comprising a third switching threshold logic path having a third switching threshold and a fourth switching threshold logic path in parallel with the third switching threshold logic path and having a fourth switching threshold higher than the third switching threshold, wherein the second portion is configured to select between the third switching threshold logic path and the fourth switching threshold logic path based on the input signal.

2. The transducer driver of claim 1, wherein the transducer driver generates the output signal as a differential output signal and the output of the transducer driver drives a first polarity of the differential output signal.

3. The transducer driver of claim 2, wherein the transducer driver further comprises:
    a second pull-up device coupled at its non-gate terminals between the supply voltage and a second output of the transducer driver for driving a second polarity of the differential output signal;
    a second pull-down device coupled at its non-gate terminals between the ground voltage and the second output of the transducer driver; and
    second predriver circuitry for driving one or more second driving signals to the second pull-up device and the second pull-down device, wherein the second polarity of the differential output signal is a function of the one or more second driving signals, and wherein the second predriver circuitry comprises:
  second pull-up predriver circuitry for receiving a third predriver signal and driving a third driving signal as a function of the third predriver signal to a gate of the second pull-up device;
  second pull-down predriver circuitry for receiving a fourth predriver signal and driving a fourth driving signal as a function of the fourth predriver signal to a gate of the second pull-down device;
  second non-overlap generation circuitry for minimizing shoot-through current through the pull-up device and the pull-down device and comprising:
    a third portion configured to condition the input signal to generate the third predriver signal, the third portion comprising a fifth switching threshold logic path having a fifth switching threshold and a sixth switching threshold logic path in parallel with the fifth switching threshold logic path and having a sixth switching threshold lower than the fifth switching threshold, wherein the third portion is configured to select between the fifth switching threshold logic path and the sixth switching threshold logic path based on the input signal; and
    a fourth portion configured to condition the input signal to generate the fourth predriver signal, the fourth portion comprising a seventh switching threshold logic path having a seventh switching threshold and an eighth switching threshold logic path in parallel with the seventh switching threshold logic path and having an eighth switching threshold higher than the seventh switching threshold, wherein the fourth portion is configured to select between the seventh switching threshold logic path and the eighth switching threshold logic path based on the input signal.

4. The transducer driver of claim 3, wherein the input signal comprises a differential input signal having a first polarity and a second polarity.

5. The transducer driver of claim 4, wherein:
the first portion and the second portion condition the first polarity of the input signal; and
the third portion and the fourth portion condition the second polarity of the input signal.

6. The transducer driver of claim 5, wherein:
the first portion is configured to select between the first switching threshold logic path and the second switching threshold logic path based on a logical combination of the first polarity of the input signal and the second polarity of the input signal;
the second portion is configured to select between the third switching threshold logic path and the fourth switching threshold logic path based on a logical combination of the first polarity of the input signal and the second polarity of the input signal;
the third portion is configured to select between the fifth switching threshold logic path and the sixth switching threshold logic path based on a logical combination of the first polarity of the input signal and the second polarity of the input signal; and
the fourth portion is configured to select between the seventh switching threshold logic path and the eighth switching threshold logic path based on a logical combination of the first polarity of the input signal and the second polarity of the input signal.

7. A method comprising:
driving, with an output driver, an output signal to a transducer as a function of an input signal received by a transducer driver, wherein the output driver comprises:
  a pull-up device coupled at its non-gate terminals between a supply voltage and an output of the transducer driver; and
  a pull-down device coupled at its non-gate terminals between a ground voltage and the output of the transducer driver;
driving, with predriver circuitry, one or more driving signals to the output driver, wherein the output signal is a function of the one or more driving signals, and wherein the predriver circuitry comprises:
  pull-up predriver circuitry for receiving a first predriver signal and driving a first driving signal as a function of the first predriver signal to a gate of the pull-up device; and
  pull-down predriver circuitry for receiving a second predriver signal and driving a second driving signal as a function of the second predriver signal to a gate of the pull-down device;
conditioning, with a first portion of non-overlap generation circuitry, the input signal to generate the first predriver signal, the first portion comprising a first switching threshold logic path having a first switching threshold and a second switching threshold logic path in parallel with the first switching threshold logic path and having a second switching threshold lower than the first switching threshold, wherein the first portion is configured to select between the first switching threshold logic path and the second switching threshold logic path based on the input signal; and
conditioning, with a second portion of the non-overlap generation circuitry, the input signal to generate the second predriver signal, the second portion comprising a third switching threshold logic path having a third switching threshold and a fourth switching threshold logic path in parallel with the third switching threshold logic path and having a fourth switching threshold higher than the third switching threshold, wherein the second portion is configured to select between the third switching threshold logic path and the fourth switching threshold logic path based on the input signal.

8. The method driver of claim 7, further comprising generating, with the transducer driver, the output signal as a differential output signal and the output of the transducer driver driving a first polarity of the differential output signal.

9. The method of claim 8, wherein the transducer driver further comprises:
a second pull-up device coupled at its non-gate terminals between the supply voltage and a second output of the transducer driver for driving a second polarity of the differential output signal;
a second pull-down device coupled at its non-gate terminals between the ground voltage and the second output of the transducer driver; and
second predriver circuitry for driving one or more second driving signals to the second pull-up device and the second pull-down device, wherein the second polarity of the differential output signal is a function of the one or more second driving signals, and wherein the second predriver circuitry comprises:

second pull-up predriver circuitry for receiving a third predriver signal and driving a third driving signal as a function of the third predriver signal to a gate of the second pull-up device; and second pull-down predriver circuitry for receiving a fourth predriver signal and driving a fourth driving signal as a function of the fourth predriver signal to a gate of the second pull-down device; and the method further comprises:

conditioning, with a third portion of the non-overlap circuitry, the input signal to generate the third predriver signal, the third portion comprising a fifth switching threshold logic path having a fifth switching threshold and a sixth switching threshold logic path in parallel with the fifth switching threshold logic path and having a sixth switching threshold lower than the fifth switching threshold, wherein the third portion is configured to select between the fifth switching threshold logic path and the sixth switching threshold logic path based on the input signal; and conditioning, with a fourth portion of the non-overlap signal, the input signal to generate the fourth predriver signal, the fourth portion comprising a seventh switching threshold logic path having a seventh switching threshold and an eighth switching threshold logic path in parallel with the seventh switching threshold logic path and having an eighth switching threshold higher than the seventh switching threshold, wherein the fourth portion is configured to select between the seventh switching threshold logic path and the eighth switching threshold logic path based on the input signal.

10. The method of claim 9, wherein the input signal comprises a differential input signal having a first polarity and a second polarity.

11. The method of claim 10, further comprising:

conditioning the first polarity of the input signal with the first portion and the second portion; and conditioning the second polarity of the input signal with the third portion and the fourth portion.

12. The method of claim 11, further comprising:

selecting, with the first portion, between the first switching threshold logic path and the second switching threshold logic path based on a logical combination of the first polarity of the input signal and the second polarity of the input signal;

selecting, with the second portion, between the third switching threshold logic path and the fourth switching threshold logic path based on a logical combination of the first polarity of the input signal and the second polarity of the input signal;

selecting, with the third portion, between the fifth switching threshold logic path and the sixth switching threshold logic path based on a logical combination of the first polarity of the input signal and the second polarity of the input signal; and selecting, with the fourth portion, between the seventh switching threshold logic path and the eighth switching threshold logic path based on a logical combination of the first polarity of the input signal and the second polarity of the input signal.

* * * * *

UNITED STATES PATENT AND TRADEMARK OFFICE
CERTIFICATE OF CORRECTION

| | |
|---|---|
| PATENT NO. | : 10,985,746 B1 |
| APPLICATION NO. | : 16/824414 |
| DATED | : April 20, 2021 |
| INVENTOR(S) | : Ramin Zanbaghi |

It is certified that error appears in the above-identified patent and that said Letters Patent is hereby corrected as shown below:

In the Specification

1. In Column 7, Line 62, delete "skill" and insert -- skilled --, therefor.

In the Claims

2. In Column 10, Line 49, in Claim 8, delete "The method driver of claim" and insert -- The method of claim --, therefor.

3. In Column 11, Line 4, in Claim 9, delete "device; and" and insert -- device; --, therefor.

Signed and Sealed this
Fifteenth Day of November, 2022

*Katherine Kelly Vidal*

Katherine Kelly Vidal
*Director of the United States Patent and Trademark Office*